United States Patent [19]

Furudate et al.

[11] Patent Number: 5,127,447

[45] Date of Patent: Jul. 7, 1992

[54] METHOD OF BENDING OUTER LEADS OF A SEMICONDUCTOR DEVICE

[75] Inventors: Nobuhiro Furudate, Iwate; Minoru Togashi, Chigasaki, both of Japan

[73] Assignee: Kabushiki Kaisha Toshiba, Kawasaki, Japan

[21] Appl. No.: 690,272

[22] Filed: Apr. 24, 1991

[30] Foreign Application Priority Data

Apr. 25, 1990 [JP] Japan .................................. 2-109871

[51] Int. Cl.⁵ ............................................... B21F 1/00
[52] U.S. Cl. ...................................................... 140/105
[58] Field of Search ............................ 140/105, 147

[56] References Cited

U.S. PATENT DOCUMENTS

| 4,829,669 | 5/1989 | Nakajima ............................ 140/105 |
| 4,957,146 | 9/1990 | Satterfield et al. ................. 140/105 |
| 5,078,186 | 1/1992 | Togashi et al. . | |

*Primary Examiner*—Lowell A. Larson
*Attorney, Agent, or Firm*—Finnegan, Henderson, Farabow, Garrett and Dunner

[57] ABSTRACT

A method of bending outer leads of a semiconductor device, wherein the outer leads arranged substantially horizontally are preparatorily bent upward or downward from their roots, and thereafter bent into a predetermined configuration, thereby to obtain final outer leads.

8 Claims, 5 Drawing Sheets

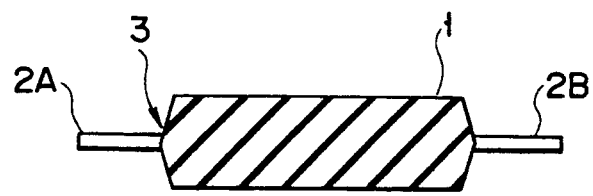
F I G. 3A
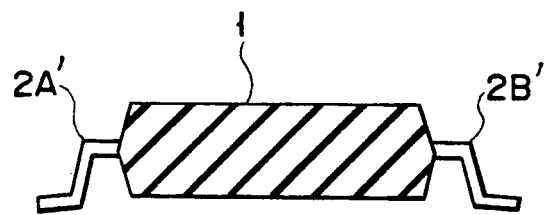
F I G. 3B
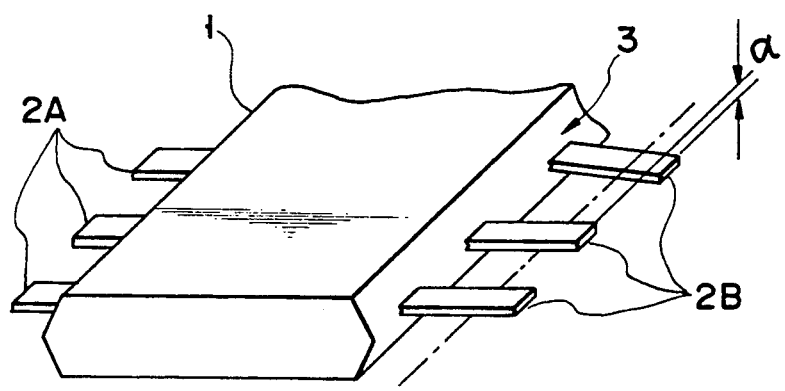
F I G. 4

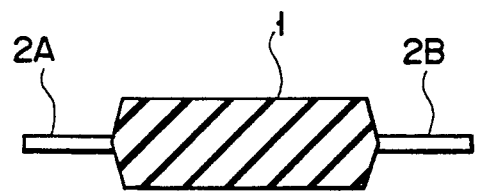
F I G. 5A
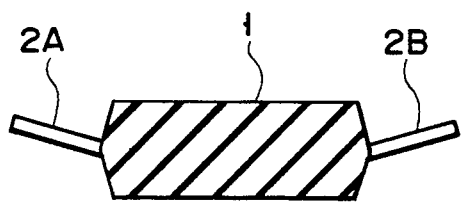
F I G. 5B
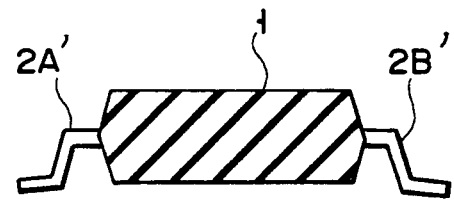
F I G. 5C
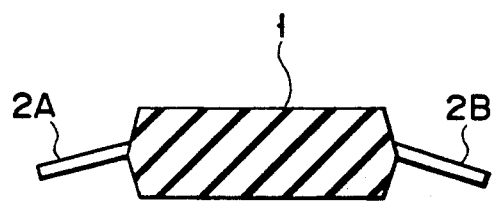
F I G. 5D

|  | CONVENTIONAL DEVICE | PRESENT INVENTION |
|---|---|---|
| AVERAGE OF LEAD COPLANARITY $\bar{X}$ (μm) | THE NUMBER OF MEASURED DEVICES 40 $\bar{X} = 60$ (μm) | THE NUMBER OF MEASURED DEVICES 40 $\bar{X} = 30$ (μm) |
| STANDARD DEVIATION ($\sigma_{n-1}$) | $\sigma_{n-1} = 20$ | $\sigma_{n-1} = 9$ |

F I G. 6

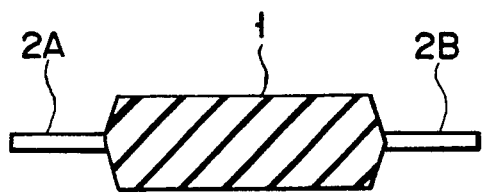
F I G. 7A
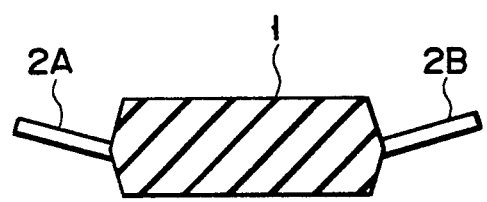
F I G. 7B
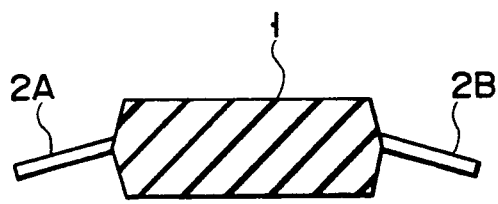
F I G. 7C
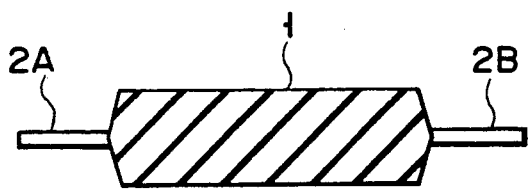
F I G. 7D
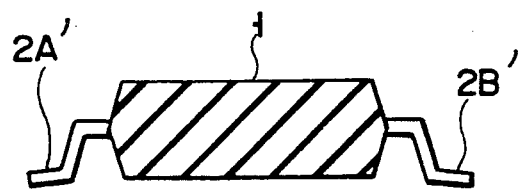
F I G. 7E

METHOD OF BENDING OUTER LEADS OF A SEMICONDUCTOR DEVICE

BACKGROUND OF THE INVENTION

1. Field of the Invention

This invention relates to an improved method of bending the outer leads of a semiconductor device of QFP (Quad Flat Package) or SOP (Small Outline Package) type.

2. Description of the Related Art

In general, SOP and QFP type semiconductor devices have appearances such as are shown in FIGS. 1 and 2, respectively. The final configurations of outer leads of these semiconductor devices are formed by use of molds.

A conventional method of bending outer leads of a semiconductor device is as follows:

As is shown in FIG. 3A, a plurality of outer leads 2A and 2B protruding rightward and leftward from a resin 1 are simultaneously bent, thereby forming the final semiconductor device configuration as is shown in FIG. 3B.

The above method, however, has the following drawbacks:

The outer leads, before they are bent, have a variation c in the vertical direction relative to their root 3, the variation a resulting from contraction of the resin in a molding step or deburring. Since the variation in the outer leads 2A and 2B remains eve after they have been bent, the coplanarity of the final outer leads 2A' and 2B' is degraded and the final configuration is unstable.

SUMMARY OF THE INVENTION

The present invention has been conceived to overcome the above-described drawbacks, and its object is to provide a method of bending the outer leads of a semiconductor device, wherein the outer leads are first preparatorily bent to correct variations, thereby improving their coplanarity and resulting in a stable final product.

To achieve this object, the method of bending the outer leads according to the present invention comprises the steps of preparatorily bending all the outer leads arranged substantially horizontally, upward or downward from their roots, and bending the outer leads into their final configuration.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are cross-sectional views showing a conventional method of bending the outer leads of a semiconductor device;

FIG. 4 is a perspective view showing a variation in outer leads;

FIGS. 5A to 5D are cross sectional views showing a method of bending the outer leads of a semiconductor device according to one embodiment of the present invention;

FIG. 6 is a diagram showing the effects of the present invention; and

FIGS. 7A to 7E are cross sectional views showing a method of bending the outer leads of a semiconductor device according to another embodiment of the present invention.

DETAILED DESCRIPTION OF THE PREFERRED EMBODIMENTS

Figure 1:
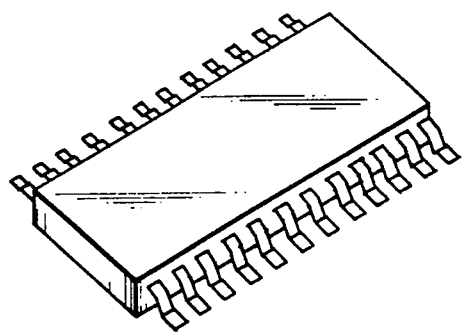
FIG. 1 is a perspective view showing a SOP type semiconductor device.
Figure 2:
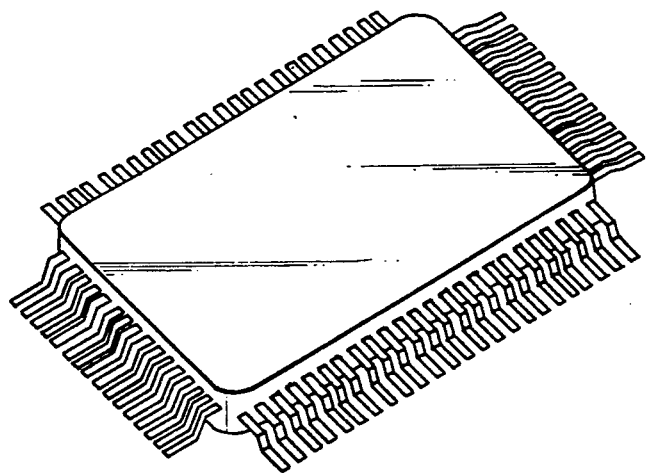
FIG. 2 is a perspective view showing a QFP type semiconductor device.

Embodiments of the present invention will now be described with reference to the accompanying drawings. To keep the description simple, like reference numerals are used to designate corresponding parts in FIGS. 3A and 3B.

FIGS. 5A to 5D show a method of bending the outer leads of a semiconductor device according to one embodiment of the present invention.

As shown in FIG. 5A, a plurality of outer leads 2A and 2B protruding from a resin 1 are arranged substantially horizontally, but have variations in the vertical direction. As shown in FIG. 5B, to correct these variations, all of the outer leads 2A and 2B are first preparatorily bent upward from their roots. Thereafter, as shown in FIG. 5C, they are bent to form predetermined configurations, thereby realizing a final product having final outer leads 2A' and 2B'.

Alternatively, as shown in FIG. 5D, the outer leads 2A and 2B can be preparatorily bent downward from their roots, to correct the variations, and thereafter, as shown in FIG. 5C, bent to form final outer leads 2A' and 2B'.

Since, according to the above method, the outer leads 2A and 2B are first preparatorily bent upward or downward from their roots, variations in the leads, resulting from contraction of the resin in a molding step or deburring are corrected. Hence, the final configurations of the outer leads 2A' and 2B' are free from variations existing prior to the leads being preparatorily bent. Thus, the coplanarity of the outer leads 2A' and 2B' is improved as compared to that of a conventional device, and the configuration of the final product is stable.

FIG. 6 shows coplanarities of outer leads 2A' and 2B' (averages $\overline{X}$ ($\mu$m) of variations) and standard deviations ($\sigma_{n-1}$) of the coplanarities of a semiconductor device shaped by a method of the present invention (referred to as the present invention) and a device shaped by a conventional method (referred to as the conventional device). As is obvious from FIG. 6, the average $\overline{X}$ of variations of the outer leads 2A and 2B of the present invention is half that of the conventional device. In addition, the standard deviation of the present invention is much smaller than that of the conventional device.

FIGS. 7A to 7E show a method of bending the outer leads of a semiconductor device according to another embodiment of the present invention.

As shown in FIG. 7A, outer leads 2A and 2B protruding from a resin 1 are arranged substantially horizontally, but have variations in the vertical direction. Therefore, all of the outer leads 2A and 2B are first preparatorily bent upward from their roots, as is shown in FIG. 7B, and then bent downward as is shown in FIG. 7C. Thereafter, they are returned to horizontal as is shown in FIG. 7D, with the result that the variations are corrected. Lastly, they are bent to predetermined configurations, as is shown in FIG. 7E, thereby producing a final semiconductor device having final outer leads 2A' and 2B'.

Alternatively, the outer leads 2A and 2B can be preparatorily bent first downward and thereafter upward. Further, the outer leads 2A and 2B need not be bent horizontally before a final configuration is formed, after preparatory bending upward or downward. In addition, the outer leads 2A and 2B can be preparatorily bent upward or downward two or more times.

According to the above method, the outer leads 2A and 2B are first preparatorily bent, resulting in the same effect as in the embodiment shown in FIGS. 5A to 5D.

The method of the present invention can be applied not only to an SOP type semiconductor device, but to substantially all types of semiconductor device such as QFP types having 44 pins, 60 pins, 100 pins, or 144 pins.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of bending outer leads of a semiconductor device which includes a package and a plurality of outer leads extending therefrom, the method comprising the steps of:
preparatorily bending all of the outer leads in one of a substantially upward direction and a substantially downward direction at bordering points where the outer leads meet the package to eliminate vertical inconsistency between all of the outer leads;
bending the outer leads to obtain final outer leads.

2. A method of bending outer leads of a semiconductor device according to claim 1, wherein the outer leads are placed back into horizontal positions before being bent to form final outer leads.

3. A method of bending outer leads of a semiconductor device which includes a package and a plurality of outer leads extending therefrom, the method comprising the steps of:
preparatorily bending all of the outer leads in a substantially upward direction at bordering points where the outer leads meet the package, and thereafter in a substantially downward direction to eliminate vertical inconsistency between all of the outer leads; and
bending the outer leads to obtain final outer leads.

4. A method of bending outer leads of a semiconductor device according to claim 3, wherein the outer leads are placed back into horizontal positions before being bent to form final outer leads.

5. A method of bending outer leads of a semiconductor device according to claim 3, wherein said outer leads are preparatorily bent at least twice.

6. A method of bending outer leads of a semiconductor device which includes a package and a plurality of outer leads extending therefrom, the method comprising the steps of:
preparatorily bending all of the outer leads in a substantially downward direction at bordering points where the outer leads meet the package, and thereafter in a substantially upward direction to eliminate vertical inconsistency between all of the outer leads; and
bending the outer leads to form final outer leads.

7. A method of bending outer leads of a semiconductor device according to claim 6, wherein the outer leads are placed back into horizontal positions before being bent to form the final outer leads.

8. A method of bending outer leads of a semiconductor device according to claim 6, wherein said outer leads are preparatorily bent at least twice.

* * * * *